United States Patent

Jones

[15] 3,645,772

[45] Feb. 29, 1972

[54] PROCESS FOR IMPROVING BONDING OF A PHOTORESIST TO COPPER

[72] Inventor: John Lester William Jones, New Shrewsbury, N.J.

[73] Assignee: E. I. du Pont de Nemours and Company, Wilmington, Del.

[22] Filed: June 30, 1970

[21] Appl. No.: 51,393

[52] U.S. Cl. ....................................117/34, 96/36.2, 96/86, 117/47, 117/75, 117/132, 117/213, 148/6.14, 156/3

[51] Int. Cl. ......................B44c 1/22, B44d 1/34, G03c 1/94

[58] Field of Search.......................117/34, 47, 75, 132, 213; 148/6.14; 96/86, 36.2; 156/3, 13, 17

[56] References Cited

UNITED STATES PATENTS

| | | | |
|---|---|---|---|
| 3,231,425 | 1/1966 | Sheratte | 156/3 X |
| 3,305,416 | 2/1967 | Kahan | 156/3 |
| 3,434,889 | 3/1969 | Haroldson et al. | 148/6.14 |
| 3,447,965 | 6/1969 | Termac | 148/6.14 X |
| 3,479,185 | 11/1969 | Chambers | 96/84 |

FOREIGN PATENTS OR APPLICATIONS

| | | | |
|---|---|---|---|
| 1,152,368 | 5/1969 | Great Britain | 96/35.1 |

*Primary Examiner*—William D. Martin
*Assistant Examiner*—William R. Trenor
*Attorney*—Lynn Barratt Morris

[57] ABSTRACT

A process for improving the bonding of photoresist layers to copper surfaces by exposing the copper surface to the action of a nitrogen-containing organic compound containing at least one other hetero-atom and at least one five- or six-membered ring. A photoresist layer is then applied to the treated copper surface. Ethanol and other solutions of the nitrogen-containing compounds are effective.

8 Claims, No Drawings

PROCESS FOR IMPROVING BONDING OF A PHOTORESIST TO COPPER

BACKGROUND OF THE INVENTION

Field of the Invention

This invention relates to photoresists and more particularly to a method of improving the resistance of photoresists to chemical attack. Still more particularly it relates to a process for improving the bonding of photoresists to a copper surface so as to resist chemical attack during etching and plating.

It is well known to etch a pattern into copper or other metal surface by applying to the surface a photoresist, exposing this photoresist through a pattern to actinic radiation to harden portions of the resist, washing out the unexposed, unhardened portions of the resist to expose the underlying metal, and etching this exposed metal with a suitable etchant. The resist which protects a portion of the surface must not allow the etchant to reach the metal which it covers. To achieve this, chemically inert high organic polymers are generally used, which are impermeable to the aqueous solutions of inorganic etchants which are generally employed. An alternative way to prepare a patterned metal surface, which is extensively used in preparing printed circuits, is to plate the metal surface, usually copper, covered with the patterned photoresist, with a metal which is deposited in the unprotected areas of the surface. When a suitable amount of metal has been deposited, the photoresist may be removed, leaving a patterned metal surface. If a conductive pattern is desired, as when the photoresist is applied to an insulating board thinly clad with copper, the thin metal areas protected from access of the plating bath may be etched away.

In most cases satisfactory materials are available for photoresists which form a smooth, pinhole-free, impermeable layer on the surface of the metal to be protected. However, the bond of the photoresist layer to the metal surface has not been found adequate for exposure to certain plating baths. In these baths, the entire resist layer or parts of it may become detached from the surface and removed, thus allowing the pattern to be marred. By the process of this invention, the bond between the resist layer and the metal surface is made more resistant to chemical attack.

SUMMARY OF THE INVENTION

It is an object of this invention to provide improved bonding of photoresists to copper surfaces. It is a further object to provide improved chemical resistance of photoresists. A further object is to provide a process for adhering photoresist to copper so that the bond between the photoresist and the copper surface is resistant to chemical attack.

The process of this invention comprises the sequential steps of exposing a copper surface to the action of a solution of a nitrogen-containing organic compound containing at least one other hetero atom and at least one five- or six-membered ring, and applying a photoresist to the treated surface. This process provides a bond between the photoresist and the copper surface which is much more resistant to chemical attack by electroplating electrolytes than the bond between photoresist and untreated copper. By the use of this process, the adhesion of the photoresist to the copper surface during electroplating is improved and circuit boards of higher quality can be produced with fewer rejects. The nitrogen-containing compounds are preferably applied from solutions.

DESCRIPTION OF THE PREFERRED EMBODIMENTS

The nitrogen-containing organic compounds used in accordance with this invention contains at least one other hetero-atom and a five- or six-membered ring. Preferred other hetero-atoms are nitrogen, sulfur, oxygen and selenium.

Heterocyclic compounds having nitrogen and one other hetero-atom in the same ring are particularly preferred compounds. Especially useful compounds are 2-amino-6-methylbenzothiazole, 2-mercaptobenzimidazole, thiobenzanilide, benzotriazole, 2-mercaptobenzothiazole, 2-mercaptothiazoline, 3-amino-1,2,4-triazole, 5-aminotetrazole monohydrate, tolutriazole, 1,2-naphthotriazole, 1-phenyl-3-mercaptotetrazole, 2-guanidinobenzimidazole, and 1-chlorobenzotriazole.

The compounds may be applied to the copper surface in several different ways. The surface may be exposed to the action of the vapors of the active compound if said compound is sufficiently volatile. A particularly preferred method of applying the active compound is to dip the copper surface in a solution of said compound in a suitable solvent. The compounds will ordinarily be soluble in water, ethanol, a chlorinated hydrocarbon, e.g., trichloroethylene, or dilute HCl (1–3 percent). The duration of the dipping treatment is somewhat critical and the optimum duration may vary from compound to compound. Typically, treatment times of 10 to 60 seconds are useful.

The photoresist useful in this process comprises a photohardenable polymerizable composition disclosed in Celeste, U.S. Pat. No. 3,469,982, issued Sept. 30, 1969, Celeste, U.S. Ser. No. 567,799, filed July 7, 1966, now U.S. Pat. No. 3,526,504, and Celeste, U.S. Pat. No. 3,448,089 issued June 3, 1969. Liquid photoresists comprising cinnamoyl esters attached to or used in conjunction with polymeric binders may also be used.

These resist-forming compositions may be applied to the copper surface by the common coating techniques such as spraying, dipping, roll coating or silk screen techniques. A particularly preferred method for applying a photopolymerizable resist layer to a copper surface is that disclosed in Celeste, U.S. Pat. No. 3,469,982.

EXAMPLE I

Plastic boards having a copper foil laminated to the surface were scrubbed with pumice, water rinsed and dried. The boards were dipped in 1 percent solutions of different agents for varying times, as given in Table I, then rinsed and dried.

To the treated copper surface of the boards there was laminated a 0.001-inch-thick photopolymerizable resist-forming layer of a photopolymerizable composition comprising a poly(methyl methacrylate) binder and a polyfunctional acrylate ester similar to those described in Celeste, U.S. Pat. No. 3,469,982, issued Sept. 30, 1969, coated on a 0.001-inch-thick polyethylene terephthalate film and dried in air. Lamination was effected by applying the coated side of the photoresist element to the copper surface of the board and passing the assembly through nip rolls heated to 105°–110° C. and having a nip pressure of 2 pounds per lineal inch. The coated boards were exposed through a negative process transparency having a test pattern in contact with the transparent support web of the resist-forming layer with a 3,750-watt pulsed xenon arc at a distance of 18 inches (nuArc Platemaker FT 26-N) for 120 seconds. The polyethylene terephthalate support web was stripped from the exposed photopolymerizable layer and the unexposed areas of this layer were washed away with a spray of 1,1,1-trichloroethane at a pressure of 20 p.s.i.g. and a temperature of 68–70° F. The boards were then water rinsed, dipped in clean 1,1,1-trichloroethane, water rinsed and dried with a stream of air. The residual copper treating agent was then removed from the exposed copper pattern by water rinsing, dipping in a 20 percent sulfuric acid solution for 40 seconds, water rinsing, dipping in a 25 percent solution of ammonium persulfate for 50 seconds, water rinsing, dipping in the sulfuric acid for 40 seconds, water rinsing and rinsing with distilled water. The cleaned samples were then copper plated in an air-agitated copper pyrophosphate plating bath (pH=8.4, temperature 120° F., pyrophosphate/copper ratio 7.4/1, ammonia concentration 0.3 oz./gal.) for 35 minutes at a cathode current density of 30 amp/square foot. This plating deposited about 1 mil of copper on the copper surfaces not covered with photoresist. Finally, the boards were water rinsed, dried, and examined. On control boards which had not been treated with an adhesion-improving compound imaged photoresist had become detached from the copper surface, particularly at the image edges. Treated boards showed a reduction or absence of this blistering and edge lifting. The results of trials with several compounds are summarized in Table I.

TABLE I

| Compound | Solvent | Dip time (seconds) | Edge lifting and blistering |
|---|---|---|---|
| 2-Amino-6-methyl-benzothiazole | 2% HCl in water | 10–60 | Greatly decreased. |
| Mercaptobenzimidazole | Ethanol | 10–60 | Do. |
| Thiobenzanilide | 1,1,2-trichloro-ethylene | 10–60 | Do. |
| Benzotriazole | 2% HCl in water | 10–60 | Do. |
| 2-Mercaptobenzothiazole | Ethanol | 10–60 | Do. |
| 2-Mercaptothiazoline | do | 10–60 | Do. |
| 5-Aminotetrazole monohydrate | do | 10 | Somewhat decreased. |
| Tolutriazole | do | 10–60 | Do. |
| 1,2-Naphthotriazole | do | 10–30 | Do. |
| 1-Phenyl-3-mercapto-tetrazole | do | 10–60 | Do. |
| 2-Guanidinobenzimidazole | do | 10–30 | Do. |
| 1-Chlorobenzotriazole | do | 30–300 | Greatly decreased. |
| 3-Amino-1,2,4-triazole | do | 30–300 | Do. |
| Benzimidazole | do | 30–300 | Do. |
| 5-Nitro-2-mercapto-benzimidazole | do | 30–300 | Do. |
| 5-Amino-2-mercapto-benzimidazole | do | 30–300 | Do. |
| 2-Aminobenzimidazole | do | 30–300 | Do. |
| 5-Methylbenzimidazole | do | 30–300 | Do. |
| 4,5-Diphenylmercapto-imidazole | do | 30–300 | Do. |
| 2-Aminothiazole | do | 30–300 | Do. |
| 2-Mercaptobenzoxazole | do | 30–300 | Do. |
| 2-Methylbenzothiazole | do | 30–300 | Somewhat decreased. |

EXAMPLE II

A polyvinyl cinnamate was made in the manner described in Minsk, et al., U.S. Pat. No. 2,670,286, Feb. 23, 1954, and this was incorporated in a coating composition of the following formula:

| | |
|---|---|
| Polyvinyl cinnamate | 5.7 g. |
| 2-t-butylanthraquinone | 0.3 g. |
| Methyl ethyl ketone to make | 60.0 g. |

Boards prepared as in Example I were dipped in a solution of benzotriazole according to the procedure of Example I, then coated with the above coating composition using a doctor knife to give a dry thickness of about 0.0002 inch. Control boards not dipped in benzotriazole solution were also prepared. The coated boards were exposed for 18 minutes through a negative process transparency with the exposure device of Example I, then developed in a trichloroethylene vapor spray for 30 seconds. The developed boards were plated and examined as in Example I. The boards which had been treated with the benzotriazole solution showed a reduction or absence of blistering and edge-lifting in relation to the control boards.

EXAMPLE III

Plastic boards covered with copper foil were cleaned as in Example I, then dipped for 1 minute in a solution of the following composition:

| | |
|---|---|
| Trichloroethylene | 98 g. |
| Poly(methyl methacrylate) (M.W. 60,000) | 1 g. |
| Benzotriazole | 1 g. |

The dipped boards were water rinsed and air dried. The treated boards were laminated, exposed, processed and plated as in Example I. The treated boards showed less edge lifting and fewer blisters than untreated control boards. In addition, the mechanical strength of the initial resist-to-copper bond was tested by applying a pressure-sensitive adhesive tape to the resist coated boards and then removing it with a sharp pull. Little or no resist was pulled from the treated boards by this test but significant amounts of resist were removed from the untreated control boards.

Copper foil-clad plastic boards were dipped in solutions of benzotriazole (1 percent in methylene chloride), benzothiazole (1 percent in methylene chloride), and 2-mercapto-benzimidazole (1 percent in isopropanol) for periods of 1 and 2 minutes and air dried. A photopolymerizable element of the type described in Example I was laminated to the surface of the treated boards and also to untreated control boards by the procedure of Example I. The laminated boards were exposed by the procedure of Example I using a 40-second exposure, then developed as in Example I. The developed samples were then plated as in Example I and examined. The treated boards showed less edge-lifting than the controls and the photoresist adhered more strongly to the copper when tested by applying a piece of pressure-sensitive adhesive tape to the surface of the resist and removing it with a sudden pull.

The embodiments of the invention in which an exclusive property or privilege is claimed are defined as follows:

1. A process for improving the bonding of a photoresist layer to a copper surface which comprises
   a. exposing a copper surface to the action of a nitrogen-containing organic compound containing at least one hetero-atom other than nitrogen and at least one five- or six-membered ring, said compound being selected from the group consisting of 2-amino-6-methylbenzothiazole, 2-mercaptobenzimidazole, benzotriazole, 1-chlorobenzotriazole, 2-mercaptobenzothiazole, 2-mercaptothiazoline, 3-amino-1,2,4-triazole, 5-amino-tetrazole monohydrate, tolutriazole, 1,2-naphthotriazole, 1-phenyl-3-mercaptotetrazole, 2-guanidinobenzimidazole, benzimidazole, 5-nitro-2-mercaptobenzimidazole, 5-amino-2-mercaptobenzimidazole, 2-aminobenzimidazole, 5-methylbenzimidazole, 4,5-diphenylmercaptoimidazole, 2-aminothiazole, 2-mercaptobenzoxazole, 2-methylbenzothiazole, and thiobenzanilide; and
   b. applying a layer of photoresist-forming material to the treated copper surface.
2. A process as set forth in claim 1, wherein the nitrogen-containing organic compound is in a solution.
3. A process as set forth in claim 1, wherein the nitrogen-containing organic compound is in an ethanol solution.
4. A process as set forth in claim 1, wherein the nitrogen-containing organic compound is in a dilute solution of hydrochloric acid.
5. A process as set forth in claim 1, wherein the nitrogen-containing organic compound is in a 1,1,2-trichloroethylene solution.
6. A process according to claim 1, wherein between steps (a) and (b) the surface of the copper is rinsed with water.
7. A process according to claim 1, wherein the organic nitrogen-containing compound is applied in a solution for 10 to 60 seconds.
8. A process according to claim 1, wherein the bond provided between the photoresist and the copper surface is more resistant to chemical attack by electroplating electrolytes than the bond between the photoresist and untreated copper.

* * * * *